United States Patent [19]

Marr

[11] 4,021,788
[45] May 3, 1977

[54] CAPACITOR MEMORY CELL
[75] Inventor: George Marr, Cupertino, Calif.
[73] Assignee: Burroughs Corporation, Detroit, Mich.
[22] Filed: May 16, 1975
[21] Appl. No.: 578,094
[52] U.S. Cl. .................. 340/173 CA; 307/238; 307/246
[51] Int. Cl.² .............. G11C 11/24; G11C 11/34
[58] Field of Search ............ 307/238, 246, 279; 340/173 R, 173 CA

[56] References Cited
UNITED STATES PATENTS

| | | | |
|---|---|---|---|
| 3,691,537 | 9/1972 | Burgess et al. | 340/173 CA |
| 3,699,544 | 10/1972 | Joynson et al. | 340/173 CA |
| 3,781,831 | 12/1973 | Neugebauer et al. | 340/173 R |
| 3,922,650 | 11/1975 | Schaffer | 340/173 CA |

*Primary Examiner*—Stuart N. Hecker
*Attorney, Agent, or Firm*—Robert J. Gaybrick; Manuel Quiogue; Kevin R. Peterson

[57] ABSTRACT

A dynamic capacitive memory cell having a storage node formed at the common junction of a fixed access capacitor and two MOS voltage variable capacitors. Data represented in the form of stored charge is written into the storage node through the fixed access capacitor under control of one of the MOS voltage variable capacitors and read out of the memory cell by a sensing device connected between the other voltage variable capacitor and ground. In another memory cell, one of the MOS voltage variable capacitors is replaced by an MOS transistor for preventing excess charge accumulation at the storage node.

11 Claims, 5 Drawing Figures

CAPACITOR MEMORY CELL

BACKGROUND OF THE INVENTION

The present invention relates to a memory cell for use in the storage of binary valued data in a digital computer. More particularly, the invention relates to a high speed dynamic memory cell comprising capacitive elements.

The trend in present day digital computers is to process data at ever-increasing speeds. In following this trend toward high speed operation, digital computer memory units have gradually undergone a change from relatively slow magnetic core devices to higher speed semiconductor devices.

Recent developments in the art have included a three-transistor MOS dynamic memory cell utilizing a voltage variable capacitor for enhancing the refresh operation in restoring charge which dissipated by leakages within the cell. It has also been proposed to employ a voltage variable capacitor to apply enhanced voltage to the gate of the MOS readout transistor to more fully turn on the readout transistor by effectively increasing its transconductance. Such developments have also been generally directed toward high speed MOS memory cells.

However, these memory cells still have inherent speed limitations in communicating stored charge information via an MOS transistor. The speed of an MOS transistor is severely limited by capacitance effects. Since read and write access time is dependent upon the switching speed of the transistor, this limitation becomes critical for a high speed memory operation.

Accordingly, a primary object of the present invention is to achieve a higher speed MOS dynamic memory cell.

It is a further object of this invention to reduce the amount of transistor switching required for communication of charge storage information in MOS dynamic memory cells.

In achieving the above-mentioned objects, the dynamic memory cell of the present invention provides a MOS voltage variable readout capacitor enabling readout of binary information in the form of stored charge at a storage node comprising the common junction of a fixed access capacitor and a MOS device which determines the value of charge to be written into the storage node.

BRIEF DESCRIPTION OF THE DRAWINGS

The foregoing and other objects, features and advantages of the invention, along with other objects and advantages which may be attained by its use, will be apparent from the following detailed description when read in conjunction with the accompanying drawing wherein.

DETAILED DESCRIPTION OF THE PREFERRED EMBODIMENT

Figure 1:
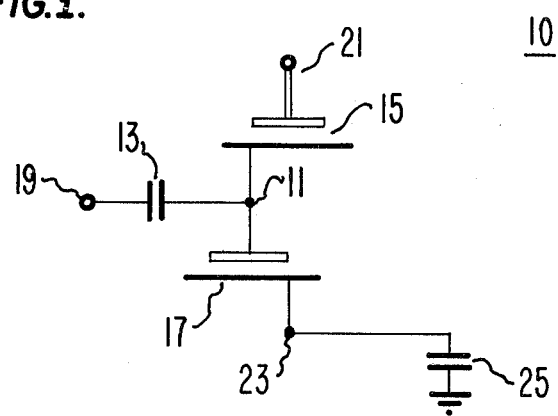
FIG. 1 is a schematic representation of the high speed capacitor memory cell of the present invention.

Referring to FIG. 1, the capacitor memory cell 10 of the present invention includes a memory node 11 formed at the common junction of a fixed access capacitor 13, an MOS voltage variable write capacitor 15 and an MOS voltage variable readout capacitor 17. The memory cell further includes an input node 19 for accepting a charge to be written into memory node 11, a write node 21 for controlling the amount of charge that is to be stored at memory node 11, and a readout node 23 through which sensing capacitor 25 senses the charge state of memory node 11.

Figure 2:
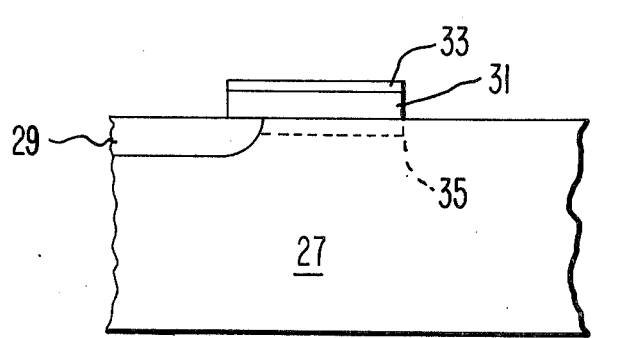
FIG. 2 is a transverse sectional view through a MOS voltage variable capacitor employable in the present invention.

FIG. 2 illustrates a voltage variable MOS capacitor 20 which may be employed in the present invention. The capacitor comprises a substrate 27 which may be formed of P-type semiconductor material, such as silicon, with a region 29 of N-type semiconductor material diffused therein according to conventional diffusion techniques. The substrate 27 and a portion of the diffused region 29 are overlaid with a dielectric layer 31 comprising silicon dioxide or other suitable insulating material well-known in the art. A relatively thin metal layer 33, in turn, overlies the dielectric layer 31. The metal layer 33, which may be silicon or aluminum and produced by conventional deposition techniques, forms the gate electrode of the MOS voltage variable capacitor 20. The diffused region 29 forms the drain electrode of the MOS voltage variable capacitor 20.

To utilize the above-described MOS capacitor 20 as a voltage variable capacitor, it is necessary to operate the device in the inversion layer mode. With a device having a P-type substrate, this is accomplished by selectively applying a positive voltage at the gate electrode of the device. Application of a positive voltage which exceeds the inversion threshold voltage of the substrate region 27 creates an inversion layer 35. The inversion layer 35 is a region in the P-type substrate which actually attains N and P densities of an N-type semiconductor because the majority carriers are pushed well back into the semiconductor substrate by the strong electric field and the minority carriers are attracted to the surface of the semiconductor substrate. This inversion channel 35 is contiguous and electrically coupled to the N-type diffused region 29. Under this condition, the addition of the N-type inversion layer 35 in parallel with the gate electrode 33 creates a larger capacitance between the gate electrode 33 and the drain electrode 29. This is caused by the increase in the area of the parallel plates established by the metal layer 33 and the N-type region formed by the diffused region 29 and the invension layer 35. The threshold voltage necessary to induce the inversion layer 35 is dependent on the dielectric constant of the insulating material used in the dielectric layer 31. As the dielectric constant of the insulating material is raised, the inversion threshold voltage is lowered.

Since the MOS voltage variable capacitor employed in the present invention, as described above, is an N-channel device operated in the inversion layer mode, the voltage and pulse signals referred to hereinafter will be of positive polarity. However, it should be noted that MOS device employed in the present invention may be either N-channel or P-channel devices. If P-channel MOS devices were employed, then the voltage polarities would be changed accordingly, as is well-known in the art.

When the gate electrode of the MOS capacitor 20 is in a quiescent condition, the capacitance of the device is merely the gate capacitance overlapping the N-type region 29. This overlapping gate capacitance is relatively small when compared to the induced gate to substrate capacitance created when the device is in the inversion layer mode. Thus, a gated MOS capacitor 20 is formed having either a high or low capacitance state depending on the value of the voltage applied to its gate electrode with respect to the inversion threshold voltage of its substrate region 27.

In accordance with the fundamental equations of series capacitors, the equation for an incremental voltage change at the memory node 11 relative to an incremental voltage change at the input node 19 is given by the following equation:

$$\Delta V_M = \Delta V_I \frac{C_{MI}}{C_{MW} + C_{MI}} \quad (1)$$

where $V_M$ and $V_I$ represent the voltages at the memory node 11 and the input node 19, respectively. $C_{MI}$ represents the capacitance of the fixed capacitor 13 and $C_{MW}$ represents the variable capacitance of the write MOS capacitor 15 between the memory node 11 and the write node 21. Accordingly, if the voltage applied to the write node 21 is less than the inversion threshold voltage of the substrate 27 of the write MOS capacitor 15, then the capacitance of the write MOS capacitor 15 $C_{MW}$ will merely comprise the gate capacitance overlapping its N-type diffusion region 29. This small capacitance creates a large impedance between memory node 11 and write node 21 and thereby allows a large incremental voltage change $\Delta V_M$ to occur at the memory node 11 for a given incremental voltage change $\Delta V_I$ at the input node 19 than would otherwise occur when the gate voltage of the write MOS capacitor 15 is greater than the inversion threshold of its substrate 27. This relatively larger voltage or charge state transferred to the memory node 11 corresponds to a logical 1 state.

Conversely, when the voltage applied to the write node 21 is greater than the inversion threshold of its substrate 27, the MOS capacitor has a relatively higher capacitance and a resulting lower impedance. Thus, a charge state is not readily stored in memory node 11. Therefore, a relatively smaller change in the voltage $V_M$ at the memory node 11 results for a given voltage change $V_I$ at the input node 19. This voltage or charge state occurring at the memory node 11 corresponds to a logical 0 state. By virtue of the isolation between the memory and input nodes (11, 19) provided by the fixed access capacitor 13 and the write MOS capacitor 15, such binary valued logic state information may be retained at the memory node 11 in the form of stored charge.

The readout MOS capacitor 17 responds to the value of the stored charge retained at the memory node 11 in the same manner that the write MOS capacitor 15 is varied by the voltage applied to its gate electrode through the write node 21.

Thus, if the charge stored at the memory node 11 is representative of a logical 1, then the readout MOS capacitor 17 will be in a high capacitance state. This high capacitance state comprises both the gate capacitance overlapping the N-type silicon diffused region 29 and the capacitance created by the inversion layer 35 induced by a gate voltage exceeding the inversion threshold of the substrate region 27. This high capacitance creates a lower impedance between memory node 11 and readout node 23. This lower impedance allows an interrogating voltage applied at the input 19 to be readily sensed at the readout node 23 by a sensing capacitor 25. It should be noted that what is detected at the readout node 23 is basically a pulse of transient charge. Therefore, any charge sensing means, for example, a resistor, may be employed for detecting the voltage change at the readout node 23.

If a logical 0 is stored at the memory node 11, the small amount of charge at the memory node 11 places readout MOS capacitor 17 in a low capacitance state. This condition prevents a transient voltage charge from being sensed at readout node 23 when an interrogating pulse is applied at input node 19.

In the readout mode of the memory cell, the voltage $V_W$ applied to the write node 21 of the write MOS capacitor 15 should be held constant. It is also preferable that this voltage $V_W$ applied to the gate of write MOS capacitor 15 be maintained below the inversion threshold voltage to minimize its overall capacitance during the readout operation.

The readout MOS capacitor 17 may be selected in accordance with the design parameters of Eq. (1) such that its substrate invention threshold will only be exceeded when the charge stored at the memory node 11 is in a logical 1 state.

In summary, it can be seen that a charge state can be written into the memory node 11 through the fixed access capacitor 13 under the control of the write MOS voltage variable capacitor 15. Application at the write node 21 of a voltage which is less than the inversion threshold voltage of the P-type subsrate of the write MOS capacitor 15 results in a low capacitance state of device. This creates a high impedance between the memory node 11 and the write 21 and allows a large amount of charge to be written into the memory node 11 through fixed access capacitor 13. A voltage at the write node 21 which exceeds the inversion threshold voltage of the write MOS capacitor 15 results in a high capacitance state which does not allow a large amount of charge to be stored at the memory node 11. Under this condition, a logical 0 may be written into the memory node 11. In the readout mode, the amount of charge stored at the memory node 11 controls the capacitance of the readout MOS capacitor 17. A large amount of charge, which corresponds to a logical 1 state, stored at the memory node 11 results in a high capacitance state in the read MOS capacitor 17. This high capacitance creates a low impedance between the memory node 11 and the readout node 23 and allows an interrogating pulse at the input node 19 to be readily sensed at the readout node 23 by the sensing capacitor 25. A low state at the memory node 11 results in a low capacitance state of the readout MOS capacitor 17 which creates a high impedance between the memory node 11 and the readout node 23. This high impedance prevents the sensing capacitor 25 from sensing the interrogating pulse applied to the node 19.

In the readout mode of the memory cell, with the voltage applied to the write node 21 held constant and below the substrate inversion threshold voltage of the write MOS capacitor 15, the incremental voltage change $\Delta V_R$ seen at the readout node 23 is given by the following equation, obtained by solving the capacitance network of FIG. 1:

$$\Delta V_R = \Delta V_I \cdot \frac{C_{MI}}{\left(\frac{C_S}{C_{MR}} + 1\right)} \cdot \left(C_{MW} + \frac{C_{MR}C_S}{C_{MR} + C_S} + C_{MI}\right)^{-1} \quad (2)$$

where:
$\Delta V_R$ is the transient voltage change at the readout node 23;
$\Delta V_I$ is the incremental change in the interrogating signal voltage applied to input node 19;
$C_{MI}$ is the value of the capacitance across the fixed access capacitor 13;
$C_{MW}$ is the value of the capacitance of the write MOS capacitor in the readout mode;
$C_{MR}$ is the value of the capacitance of the readout MOS capacitor 17 which is dependent on the value of the stored charge at the memory node 11; and
$C_S$ is the value of the capacitance of the sensing capacitor 25.

By considering the transient voltage pulse seen at the readout node 23 only when the memory node 11 is in one of its two logic states, the above equation may be simplified to the equations which follow below depending on which state is at the memory node 11.

The design parameters of the sensing means capacitor may also be chosen such that when the stored charge at the memory node 11 represents a logical 0 the capacitance $C_{MR}$ of the readout MOS capacitor 17 is much less than the capacitance $C_S$ of the sensing means capacitor 25. Therefore, with $C_{MR} << C_S$, Eq. (2) may be simplified to the following approximation:

$$\Delta V_R \cong \Delta V_I \cdot \frac{C_{MI}}{\frac{C_S}{C_{MR}}(C_{MW} + C_{MR} + C_{MI})} \quad (3)$$

If the capacitance $C_{MR}$ of the readout MOS capacitor 17 is approximately equal to the capacitance $C_{MW}$ of the write MOS capacitor, which are both in the low capacitance state when reading a logical 0, then Eq. (3) may be written as:

$$\Delta V_R \cong \Delta V_I \cdot \frac{C_{MI}}{2C_S + C_{MI} \cdot \left(\frac{C_S}{C_{MR}}\right)} \quad (4)$$

Since $C_S$ is much greater than $C_{MR}$, and since $C_{MI}$ will be chosen to be quite small to prevent charge leakage, Eq. (4) can be further simplified to the following:

$$\Delta V_R \cong \Delta V_I \left(\frac{C_{MI}}{2C_S}\right) \quad (5)$$

The design parameters of the readout MOS capacitor 17 relative the sensing capacitor 25 should also be such that when stored charge of the memory node 11 represents a logical 1, the capacitance $C_{MR}$ of the readout MOS capacitor 17 is much greater than the capacitance $C_S$ of the sensing capacitor 25. Under this condition, with $C_{MR} >> C_S$, Eq. (2) may be simplified to the following approximation which represents a logical 1 state:

$$\Delta V_R \cong \Delta V_I \frac{C_{MI}}{(C_{MW} + C_S + C_{MI})} \quad (6)$$

By proper choice of capacitance parameters, the sensing $C_S$ may also be chosen to be much greater than the capacitance $C_{MW}$ of the write MOS capacitor 15 which is in the low capacitance state during the readout operation. Under this condition Eq. (6) may be written as follows:

$$\Delta V_R \cong \Delta V \frac{C_{MI}}{(C_S + C_{MI})} \quad (7)$$

Since the capacitance $C_{MI}$ of the fixed access capacitor should be made small to prevent charge leakage from the memory node 11, appropriate choice of the value of the capacitance $C_{MI}$ of the fixed access capacitor allows the following simplification:

$$\Delta V_R \cong \Delta V_I \frac{C_{MI}}{C_S} \quad (8)$$

From Eq. (5) and (8), it is readily apparent that appropriate choice of the capacitance values of the capacitors in memory cell achieves a two to one ratio in the readout node voltage change $\Delta V_R$ relative to a constant interrogating signal voltage change $\Delta V_I$ for the logical states 1 and 0 respectively. Furthermore, the magnitude of the voltage signal $\Delta V_R$ at the readout node 23 is almost solely dependent on the magnitude of the interrogating signal voltage $\Delta V_I$ applied at the input node 19 and the charge state at the memory node 11. Thus, a memory cell is achieved in which binary valued logic state information may be written into and stored in a storage node and subsequently may be written into and stored in a storage node and subsequently read out of storage without transistor gating. The speed of the memory cell is constrained only by its interconnect lines and support circuits (not shown).

Figure 3:
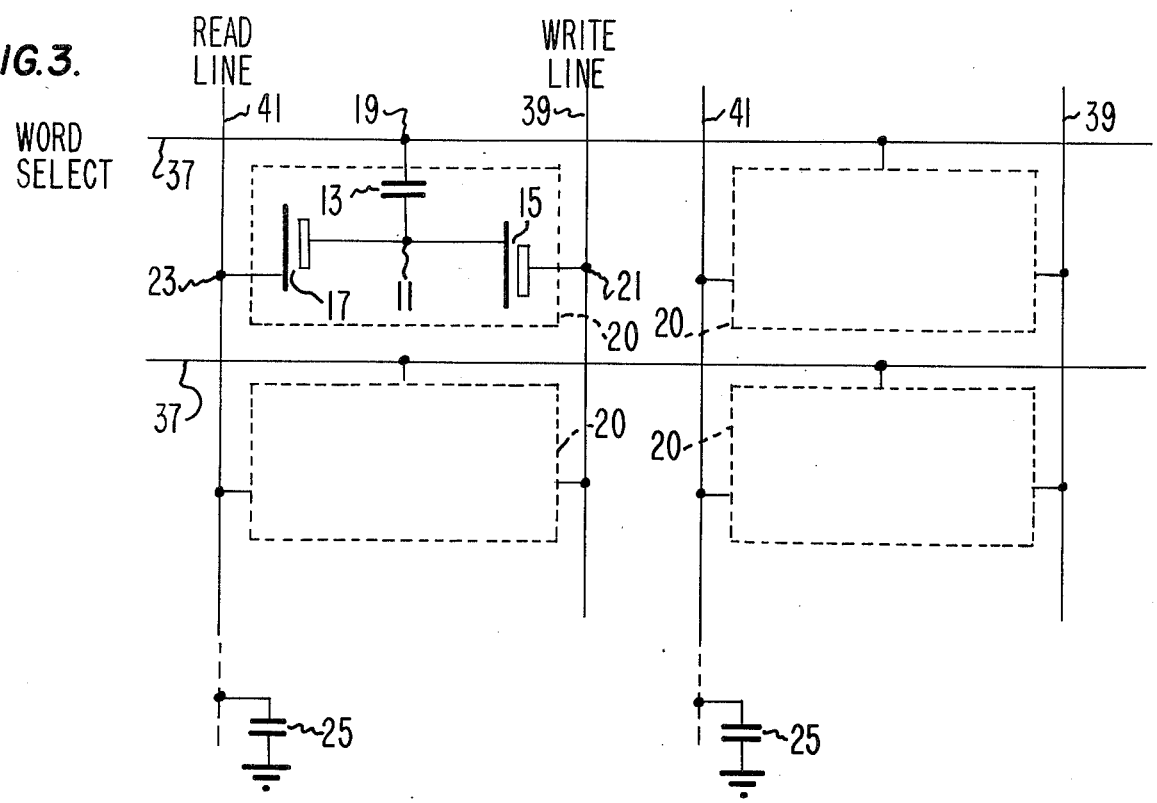
FIG. 3 is a schematic and block representation of the organization of a memory array employing the memory cell of FIG. 1.

FIG. 3 illustrates how memory cells of the present invention may be interconnected in a storage array. A word select line 37 connects all memory cells of a given word and is used to simultaneously interrogate all the cells in a word by application of an interrogate pulse at the respective input nodes 19. A write line 39 is connected to all corresponding bits in the words of the storage matrix and is used to apply the write pulses to the write nodes 21. A read line 41 is connected to all corresponding readout nodes 23. A sensing capacitor 25 is connected to each read line. Thus, each word may be selectively chosen for either a write or a read operation by applying an interrogate pulse to the proper word select line and simultaneously performing the desired operation on all cells in the selected word.

Figure 4:
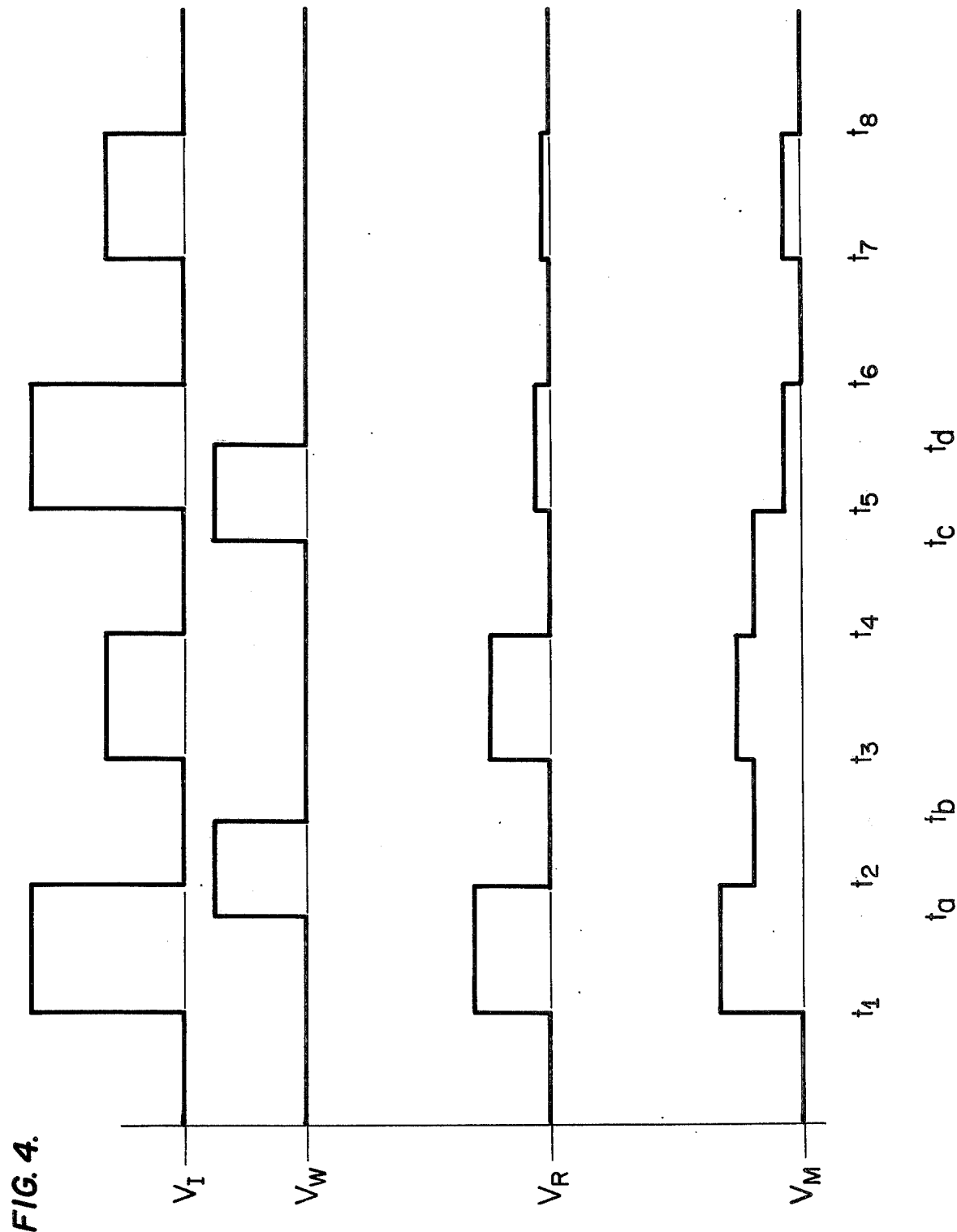
FIG. 4 is a waveform diagram illustrating the operation of the memory cell of FIG. 1.

The operation of the memory cell of the present invention may be best understood by referring to a waveform illustration (FIG. 4) of its two basic functions, namely write and read. Each of these two basic memory cell functions takes place with respect to a logical 1 state or logical 0 state. Referring to FIG. 4, $V_I$ represents the value of the interrogating signal applied at the input node 19, $V_W$ is the voltage signal applied to the write node 21, $V_R$ is the voltage at the readout node 23, and $V_M$ is the voltage at the memory node 11.

It will be noted that two pulse values for $V_I$ are used alternately. The higher pulse is the interrogate signal for the write operation; and the lower valued pulse is for the read operation. The reason for the lower valued pulse $V_I$ for the read operation is to prevent charge build-up at the memory node 11 when a logical 0 is being read. To insure that the charge state at the memory node 11 is properly read, the value of the interrogate pulse $V_I$ for the read operation should be at least equal to the threshold voltage at the readout MOS capacitor 17. This value of $V_I$ will insure that the presence of a charge state at the memory node 11 is readily detected at the readout node 23, while also preventing charge build-up which would change the logical state stored in the memory node 11. The higher pulse value for $V_I$ should be approximately twice the threshold voltage of the readout MOS capacitor 17 to assure that a charge state representing a logical 1 is stored if the voltage $V_W$ applied at the write node 21 is low.

The writing of a logical 1 takes place between $t_1$ and $t_2$. An interrogating pulse is applied to the input node 19 during which $V_W$, which is applied to the write node 21, remains at a low level until $t_a$ which occurs near the end of the interrogating pulse. This pulse applied to the write node 21 remains until $t_b$ which occurs before the next interrogate pulse. The low value $V_W$ of the voltage applied at the write node 21 keeps the capacitance of the write MOS capacitor 15 at a low value which allows a high charge state to be stored at the memory node 11. Subsequent application of a pulse $V_W$ at the write node 21 only partially removes the charge of memory node 11 because of the isolation of the memory node. Therefore, the voltage $V_M$ of memory node 11 remains substantially above ground between $t_2$ and $t_3$ during which no signal is applied to the input node 19.

A read function takes place between $t_3$ and $t_4$ upon the application of an interrogate pulse $V_I$ at the input node 19. During the read operation, no voltage is applied to the write node 21 in order to isolate the memory node 11 and to minimize charge dissipation through the write MOS capacitor 15. The high charge state at the memory node 11 places the readout MOS capacitor 17 in a high capacitance state while the interrogate pulse is being applied to the input node 19. Therefore, a readily discernable voltage $V_R$ appears at the readout node 23 during the period between $t_3$ and $t_4$.

A write operation takes place between $t_5$ and $t_6$ during which a logical 0 is written into the memory node 11. Prior to the interrogate pulse, a write voltage $V_W$ is applied to the write node 21 at $t_c$ which places write MOS capacitor 15 in a high capacitance state until $t_d$ when the signal at the write node 21 is removed. In accordance with Eq. (1), this condition results in a decreased charge at the memory node 11 due to the high capacitance state of the write MOS capacitor 15. Removal of the input and write pulses from their respective nodes (19 and 21) between $t_6$ and $t_7$ results in further dissipation of charge from the memory node 11, thus putting it in a logical 0 state.

A read operation takes place between $t_7$ and $t_8$ when an interrogate pulse $V_I$ is applied to the input node 19. During the pulse, the write MOS capacitor 15 is in a low capacitance state because of the low voltage at the write node 21. The low capacitance of the read MOS capacitor 17 minimizes the voltage pulse sensed at the readout node 23 which occurs upon application of an interrogate pulse $V_I$ at the input node 19. Since the interrogate pulse during the read operation is the lower valued pulse and the write MOS capacitor 15 is in a low capacitance state, very little charge accumulates at the memory node 11; and what does accumulate dissipates upon removal of the interrogate pulse $V_I$ from the input node 19.

It is an inherent characteristic of a dynamic cell for the charge stored at a memory node 11 to be dissipated by leakages within the memory cell. Therefore, the binary valued information stored at the memory node 11 must be periodically refreshed in order to compensate for this dissipation of stored charge. Such a refresh operation may be readily accomplished in the present invention upon application of a refresh signal to the readout node 23 by conventional peripheral circuits (not shown).

It has been found that a charge pumping problem may arise if a logical 1 is written into the memory node 11 while it is already in a logical state 1 state. Such charge accumulation in the memory node 11 would be difficult to remove in order to restore a memory node into a logical 0 state. This problem may presently be dealt with according to either of the following techniques.

One method of avoiding charge pumping at the memory node 11 is to always precede a write 1 operation with a write 0 operation. This may be accomplished by employing conventional external high speed driving circuits techniques.

Figure 5:
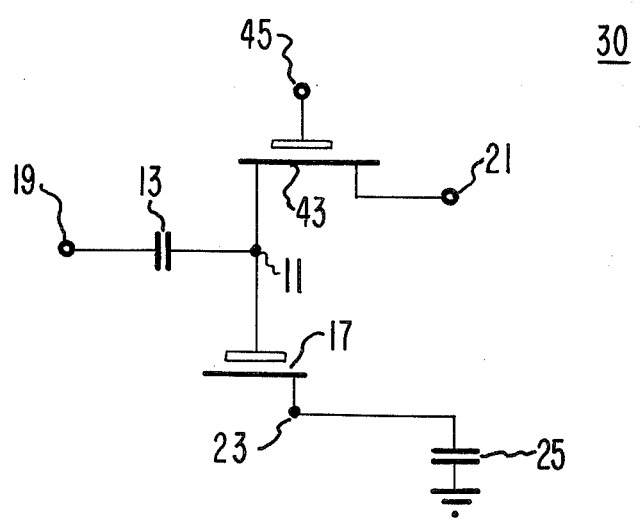
FIG. 5 is a schematic representation of an alternate embodiment of the present invention.

FIG. 5 illustrates an alternate method of avoiding excessive accumulation of charge in the memory node 11. The memory cell 30 uses an MOS transistor 43 in place of the write MOS capacitor 15. This will result in a write cycle speed approximately the same as in a three-transistor MOS memory cell. However, by employing the read MOS voltage variable capacitor 17 for the readout cycle of the memory cell as previously described, the present invention still maintains a significant speed advantage over the prior art devices.

In this embodiment of the memory cell of the present invention, the MOS transistor 43 is employed as an input gating device, having its gate electrode connected to a bit enable node 45. One of its other electrodes is connected to the write node 21. The remaining electrode of the MOS transistor 43 is connected to the memory node 11 formed by the common junction of the fixed access capacitor 13 and the gate electrode of the readout MOS voltage variable capacitor 17.

In order to write binary valued information into the memory cell 30 employing the MOS transistor 43 for input gating, an appropriate voltage signal is selectively applied to the write node 21 while the input node 19 is maintained in a quiescent condition at ground potential, and a pulse is concurrently applied to the bit enable node 45 causing the MOS transistor 43 to conduct.

If a logical 1 is to be stored at the storage node 11, a high voltage signal is applied to the write node 21. Concurrently, a pulse is applied to the gate of the MOS transistor 43 through the bit enable node 45. This renders the MOS transistor 43 conductive, causing the fixed access capacitor to become charge. The stored charge state at the memory node 11 thereby becomes a logical 1 state.

Writing a logical 0 requires that a low voltage signal be applied at the write node 21 while the input node 19 is maintained at a quiescent ground potential. Concurrent application of pulse to the bit enable node 45 causes the MOS transistor 43 to conduct. Since the write node 21 is at low potential, any charge stored at the memory node 11 discharges through the MOS transistor 43, thereby writing a logical 0 into the memory node 11.

Readout of logic state information stored at the memory node 11 is enabled by the readout MOS voltage variable capacitor 17 in substantially the same manner as previously described for the all-capacitor memory cell 10.

It will be obvious to those skilled in the art that various modifications may be made within the spirit and scope of the present invention.

What is claimed is:

1. A dynamic capacitive memory cell for storage of binary valued information manifested by two levels of charge in the form of a high charge state or a low charge state written into a storage node and for readout from the storage node of the high charge state or of the low charge state stored therein comprising:
    capacitive input means coupled to the storage node for accepting successive node establishing pulses and node readout pulses;
    control means coupled to the storage node and cooperating with said capacitive input means during said node establishing pulses for establishing the level of charge written into the storage node through said capacitive input means at either said high charge state or said low charge state, said control means also cooperating with said capacitive input means for isolating the established high charge state or low charge state of the storage node;
    sensing means; and
    capacitive readout means coupled to the storage node and to said sensing means, said capacitive readout means respectively maintained at a high capacitance level or a low capacitance level responsive to the established high charge state or low charge state isolated at the storage node for enabling operative coupling of said node readout pulses from said capacitive input means through said storage node and said capacitive readout means to said sensing means when said capacitive readout means is at said high capacitance level and for disabling operative coupling of said node readout pulses to said sensing means when said capacitive readout means is at said low capacitance level.

2. The memory cell as defined by claim 1 wherein said control means comprises a first MOS voltage variable capacitor having a gate electrode and a drain electrode, said first MOS capacitor gate electrode for receiving a voltage signal for varying the capacitance of said first MOS voltage variable capacitor between a state of high gate to drain capacitance and a state of low gate to drain capacitance, said first MOS capacitor drain electrode being coupled to the storage node for maintaining the level of charge at the storage node at said low charge state when said gate to drain capacitance is at said high state and at a high charge state when said gate to drain capacitance is at said low state.

3. The memory cell as defined by claim 2 wherein said first MOS capacitor comprises a high gate to drain capacitance when the information being stored at the storage node represents a logical zero state and a low gate to drain capacitance when said information being stored at the storage node represents a logical 1 state.

4. The memory cell as defined by claim 1 wherein said capacitive readout means comprises a second MOS voltage variable capacitor.

5. The memory cell as defined by claim 4 wherein said second MOS voltage variable capacitor includes a gate electrode and a drain electrode, said second MOS capacitor gate electrode being coupled to the storage node for establishing the capacitance of said second MOS voltage variable capacitor at said high capacitance level or said low capacitance level respectively responsive to the high charge state or low charge state isolated at the storage node and said second MOS voltage variable capacitor drain electrode being directly coupled to said sensing means.

6. The memory cell as defined by claim 5 wherein said second MOS capacitor comprises a high gate to drain capacitance when the information stored at the storage node represents a logical 1 and a low gate to drain capacitance when the information stored at the storage node represents a logical 0 state.

7. A dynamic memory cell for storage of binary valued information in the form of distinct charge states written into a storage node and for readout from the storage node of the charge state stored therein comprising:
    capacitive input means coupled to the storage node for accepting an input of a fixed amount of charge;
    a first MOS voltage variable capacitor having a gate electrode and a drain electrode, said first MOS capacitor gate electrode for receiving a voltage signal for varying the capacitance of said first MOS capacitor and said first MOS capacitor drain electrode being coupled to the storage node for controlling the value of the charge state stored at the storage node through said capacitive input means in accordance with the varied capacitance of said first MOS capacitor, said first MOS capacitor also cooperating with said input means for isolating the charge stored at the memory node;
    means for sensing the charge state stored at the storage node; and
    a second MOS voltage variable capacitor having a gate electrode and a drain electrode, said second MOS capacitor gate electrode being coupled to the storage node for varying the capacitance of said second MOS voltage variable capacitor in accordance with the value of the charge state isolated at the storage node and said second MOS capacitor drain electrode being directly coupled to said sensing means.

8. A dynamic capacitive memory cell for storage of binary valued information in the form of a high charge state or a low charge state written into a storage node and for readout from the storage node of the charge state stored therein comprising:
    capacitive input means coupled to the storage node for accepting node readout pulses;
    a MOS transistor having a first electrode at its gate electrode and having second and third electrodes, said gate electrode for receiving an enabling signal to place said MOS transistor in a conducting state, said second electrode being coupled to the storage node for transferring charge to the storage node in cooperation with said capacitive input means, and said third electrode for accepting a control signal having a value which controls the establishing of a said high charge state or a said low charge start at the storage node, said MOS transistor also cooperating with said capacitive input means for isolating the charge state stored at the storage node;

sensing means; and capacitive readout means coupled to the storage node and to said sensing means, said capacitive readout means maintained at a high capacitance level or a low capacitance level responsive to the charge state isolated at the storage node for enabling operative coupling of said node readout pulses from said capacitive input means through said storage node and said capacitive readout means to said sensing means when said capacitive readout means is at said high capacitance level and for disabling operative coupling of said node readout pulses to said sensing means when said capacitive readout means is at said low capacitance level.

9. The memory cell as defined by claim 8 wherein said capacitive readout means comprises a MOS voltage variable capacitor.

10. The memory cell as defined by claim 9 wherein said MOS voltage variable capacitor includes a gate electrode and a drain electrode, said gate electrode being coupled to the storage node for varying the capacitance of said MOS voltage variable capacitor between said high capacitance level and said low capacitance level in accordance with the value of the charge state isolated at the storage node and said drain electrode being coupled to said sensing means.

11. The memory cell as defined by claim 10 wherein said high capacitance level of said MOS capacitor comprises a high gate to drain capacitance when the information stored at the storage node represents a logical one and said low capacitance level of said MOS capacitor comprises a low gate to drain capacitance when the information stored at the storage node represents a logical zero state.

* * * * *